United States Patent
Hayami

(10) Patent No.: US 8,852,388 B2
(45) Date of Patent: Oct. 7, 2014

(54) PLASMA PROCESSOR

(75) Inventor: Toshihiro Hayami, Amagasaki (JP)

(73) Assignee: SPP Technologies Co., Ltd., Tokyo (JP)

(*) Notice: Subject to any disclaimer, the term of this patent is extended or adjusted under 35 U.S.C. 154(b) by 1006 days.

(21) Appl. No.: 12/593,526

(22) PCT Filed: Feb. 26, 2008

(86) PCT No.: PCT/JP2008/053219
§ 371 (c)(1),
(2), (4) Date: Sep. 28, 2009

(87) PCT Pub. No.: WO2008/117608
PCT Pub. Date: Oct. 2, 2008

(65) Prior Publication Data
US 2010/0043973 A1 Feb. 25, 2010

(30) Foreign Application Priority Data
Mar. 28, 2007 (JP) .................... 2007-083966

(51) Int. Cl.
*H01J 37/32* (2006.01)
*H01L 21/3065* (2006.01)
*C23C 16/44* (2006.01)

(52) U.S. Cl.
CPC ....... *H01J 37/32935* (2013.01); *C23C 16/4411* (2013.01); *H01L 21/30655* (2013.01); *H01L 21/3065* (2013.01); *H01J 37/32082* (2013.01); *H01J 37/32522* (2013.01); *H01J 37/32623* (2013.01)
USPC .................. 156/345.37; 156/345.27; 118/724

(58) Field of Classification Search
CPC .. C23C 16/4411; C23C 16/46; C23C 16/463; H01L 21/67069; H01L 21/3065; H01L 21/30655; H01L 21/465; H01J 37/32522; H01J 37/32935; H01J 37/32623; H01J 37/32082

USPC ............ 156/345.37, 345.34, 345.53, 345.27; 118/724
See application file for complete search history.

(56) References Cited

U.S. PATENT DOCUMENTS 5,346,555 A * 9/1994 Nunotani et al. ............ 118/724
5,567,267 A * 10/1996 Kazama et al. .......... 156/345.27
(Continued)

FOREIGN PATENT DOCUMENTS

JP  09-275092 A  10/1997
JP  2001-156047 A  6/2001
(Continued)

*Primary Examiner* — Jeffrie R Lund
(74) *Attorney, Agent, or Firm* — Smith Patent Office

(57) ABSTRACT

The present invention relates to a plasma processor capable of regulating the temperature of the inner surface of the processing chamber efficiently and with excellent response, with a low-cost configuration. A plasma processor 1 includes a processing chamber 11, a processing gas supply device 20, an exhaust device 40, coils 23, a high-frequency power supply unit 24, a heater 26, a cooling device 30, and a control device 50. The cooling device 30 is configured with a cooling member 32 facing the processing chamber 11 at a distance therefrom, a cooling fluid supply section 31 for supplying cooling fluid into a cooling passage 32a of the cooling member 32 and circulates it, and annular seal members 35 and 36 provided between the cooling member 32 and the processing chamber 11. The exhaust device 40 reduces the pressure in a space S surrounded by the seal members 35 and 36, the cooling member 32, and the processing chamber 11. The control device 50 controls the exhaust device 40 to reduce the pressure in the space S when high-frequency power is not applied to the coils 23, and to set the pressure in the space S at atmospheric pressure when high-frequency power is applied to the coils 23.

2 Claims, 4 Drawing Sheets

(56) References Cited

U.S. PATENT DOCUMENTS

| | | | |
|---|---|---|---|
| 5,874,012 A * | 2/1999 | Kanai et al. | 216/67 |
| 6,951,821 B2 * | 10/2005 | Hamelin et al. | 438/706 |
| 7,029,536 B2 * | 4/2006 | Hamelin et al. | 118/715 |
| 7,079,760 B2 * | 7/2006 | Hamelin et al. | 392/416 |
| 7,208,422 B2 * | 4/2007 | Kanai et al. | 438/715 |
| 7,311,782 B2 * | 12/2007 | Strang et al. | 118/724 |
| 7,327,948 B1 * | 2/2008 | Shrinivasan et al. | 392/416 |
| 7,462,564 B2 * | 12/2008 | Hamelin et al. | 438/706 |
| 7,565,879 B2 * | 7/2009 | Kanai et al. | 118/723 MW |
| 7,815,740 B2 * | 10/2010 | Oohashi et al. | 118/724 |
| 7,964,058 B2 * | 6/2011 | Hamelin et al. | 156/345.27 |
| 8,083,855 B2 * | 12/2011 | Dhindsa et al. | 118/724 |
| 8,216,486 B2 * | 7/2012 | Dhindsa et al. | 216/67 |
| 8,409,399 B2 * | 4/2013 | LaFlamme et al. | 156/345.37 |
| 2002/0007795 A1 | 1/2002 | Bailey, III et al. | |
| 2003/0015142 A1 * | 1/2003 | Hwang et al. | 118/733 |
| 2004/0055540 A1 * | 3/2004 | Kanno et al. | 118/724 |
| 2004/0182315 A1 * | 9/2004 | Laflamme et al. | 118/715 |
| 2004/0184792 A1 * | 9/2004 | Hamelin et al. | 392/416 |
| 2005/0039683 A1 * | 2/2005 | Kanai et al. | 118/724 |
| 2005/0064717 A1 * | 3/2005 | Kanai et al. | 438/709 |
| 2005/0211386 A1 * | 9/2005 | Hamelin et al. | 156/345.52 |
| 2006/0134919 A1 * | 6/2006 | Hamelin et al. | 438/706 |
| 2006/0249254 A1 * | 11/2006 | Kanai et al. | 156/345.37 |
| 2007/0077354 A1 * | 4/2007 | O'Brien et al. | 427/248.1 |
| 2009/0111276 A1 * | 4/2009 | Dhindsa et al. | 438/710 |
| 2009/0226633 A1 * | 9/2009 | LaFlamme et al. | 427/532 |
| 2010/0043973 A1 * | 2/2010 | Hayami | 156/345.26 |
| 2010/0140224 A1 * | 6/2010 | Kanai et al. | 216/67 |
| 2011/0204029 A1 * | 8/2011 | Hamelin et al. | 216/58 |
| 2012/0070914 A1 * | 3/2012 | Dhindsa et al. | 438/5 |

FOREIGN PATENT DOCUMENTS

| | | |
|---|---|---|
| JP | 2003-514390 A | 4/2003 |
| JP | 2003-249541 A | 9/2003 |

* cited by examiner

PLASMA PROCESSOR

TECHNICAL FIELD

The present invention relates to a plasma processor wherein a predetermined processing gas is supplied into a processing chamber, a plasma is formed therefrom, and a substrate placed in the processing chamber is treated with the plasma formed from the processing gas.

BACKGROUND ART

The plasma processor is provided with at least: a processing chamber having a closed space and holding a substrate therein; a processing gas supply mechanism for supplying a processing gas into the processing chamber; an exhaust mechanism for reducing the pressure in the processing chamber; a high-frequency power supply unit for applying high-frequency power; and a plasma generating mechanism for, by the high-frequency power being applied by the high-frequency power supply unit, forming a plasma from the processing gas supplied into the processing chamber.

An example of the processing of a substrate using such a plasma processor includes an etching process. In an etching process, when, for example, fluorocarbon gas (CxFy gas) is used as a processing gas, polymers which are generated by forming a plasma from the fluorocarbon gas adhere to an inner surface of the processing chamber. The adhering amount of polymer varies depending on the temperature of the inner surface of the processing chamber. When the temperature is high, not much polymer adheres. When the temperature is low, much polymer adheres.

A flow rate of the fluorocarbon gas supplied into the processing chamber is regulated so as to be constant. Therefore, a small amount of polymer deposits on the substrate as a protective film when a large amount of polymer adheres to the inner surface of the processing chamber, and a large amount of polymer deposits on the substrate as a protective film when a small amount of polymer adheres to the inner surface of the processing chamber. Since there is a difference of the amount of the polymer depositing on the substrate between the two cases, it is not possible to perform etching efficiently. Further, it is also not possible to obtain a highly accurate etched shape. Hence, during the etching process, it is necessary to suppress a temperature rise of the inner surface of the processing chamber heated by the heat of the generated plasma to limit the temperature of the inner surface of the processing chamber within a certain range.

Conventionally, as a plasma processor capable of suppressing a temperature rise of an inner surface of a processing chamber, the plasma processor disclosed in Japanese Unexamined Patent Application Publication No. 9-275092 is suggested, for example. This plasma processor is configured to further comprise an inner member arranged at an distance from an inner peripheral surface of the processing chamber, two seal members which are arranged between an outer peripheral surface of the inner member and the inner peripheral surface of the processing chamber at a distance in the vertical direction from each other, and which form a closed space between them, and a cooling gas supply mechanism for supplying cooling gas into the space surrounded by the inner member, the processing chamber and the seal members in addition to the above-described configuration.

In this plasma processor, the cooling gas supply mechanism supplies cooling gas into the space surrounded by the inner member, the processing chamber and the seal members, and the inner member is cooled by the supplied cooling gas. Therefore, the temperature of the inner member is prevented from rising due to the heat of the generated plasma, and the temperature of the inner member is maintained within a certain range. Thereby, the amount of the polymer depositing on the substrate is stable, and the above-described disadvantage does not easily occur.

However, such a plasma processor also has the following problem. That is, since a certain time is required before the inner surface of the processing chamber (inner member) reaches a predetermined temperature by being heated by the heat of the generated plasma, it takes a certain time before the amount of the polymer depositing on the substrate is stabilized after starting the etching process. Therefore, the etching process is not stabilized until a predetermined time has elapsed after starting the etching process.

Therefore, a heater for heating the processing chamber (inner member) is provided in the plasma processor and the processing chamber (inner member) is heated by the heater in advance before starting the etching process to raise the temperature of the inner surface thereof to a predetermined temperature beforehand.

Patent document 1: Japanese Unexamined Patent Application Publication No. 9-275092.

DISCLOSURE OF INVENTION

Problem Invention is to Solve

However, when the heater is provided, two conflicting operations: one is that the inner member is heated by the heater and the other is that the inner member is cooled by cooling gas, are performed. Therefore, it is not possible to efficiently raise the temperature of the inner surface of the inner member to the predetermined temperature.

Further, in a plasma processor which is configured so that cooling gas (cooling fluid) is supplied into a space surrounded by an inner member, a processing chamber and seal members similarly to the above conventional plasma processor, if water is used as cooling fluid when regulating the temperature of the inner surface of the inner member so as to be equal to or more than 100 degrees C., there is a danger that the water supplied into the space boils and expands. Therefore, similarly to the above conventional plasma processor, a gas, an oil having a high boiling point or the like must be used as cooling fluid, which causes a problem that the cost for cooling fluid is high.

The present invention has been achieved in view of the above-described circumstances, and an object thereof is to provide a plasma processor capable of regulating the temperature of an inner surface of a processing chamber efficiently and with excellent response with a low-cost configuration.

Means for Resolving the Problem

To achieve the above-described object, the present invention relates to a plasma processor, comprising at least:
a processing chamber having a closed space and holding a substrate therein;
gas supply means for supplying a processing gas into the processing chamber;
first exhaust means for reducing the pressure in the processing chamber;
power applying means for applying high-frequency power;
plasma generating means for, by high-frequency power being applied by the power applying means, forming a plasma from the processing gas supplied into the processing chamber;

heating means for heating the processing chamber;

cooling means for cooling the processing chamber, the cooling means which is configured with: a metallic cooling member having a cooling passage through which cooling fluid flows and arranged to be in contact with the outer surface of the processing chamber or to face the outer surface of the processing chamber at a distance therefrom; cooling fluid supply means for supplying the cooling fluid into the cooling passage of the cooling member; and an annular seal member provided between the cooling member and the processing chamber to be in contact with them;

second exhaust means for reducing the pressure in the annulus of the seal member; and control means for controlling the operations of the gas supply means, first exhaust means, second exhaust means, power applying means, heating means and cooling means, wherein the control means is configured to control the second exhaust means so that the pressure in the annulus of the seal member is reduced to a predetermined pressure when high-frequency power is not applied to the plasma generating means by the power applying means, and to control the second exhaust means so that the pressure in the annulus of the seal member is higher than the predetermined pressure when high-frequency power is applied to the plasma generating means by the power applying means.

According to the present invention, first of all, under the control of the control means, the pressure in the annulus of the seal member (the portion surrounded by the seal member, the cooling member, and the processing chamber) is reduced to the predetermined pressure by the second exhaust means. At the same time, the processing chamber is heated by the heating means and the temperature of the inner surface of the processing chamber rises to a predetermined temperature. Even when the cooling member and the processing chamber are disposed in contact with each other, since the contact surface of the cooling member and the contact surface of the processing chamber are not flat to be exact, but slightly uneven, the cooling member and the processing chamber cannot stick firmly to each other, and due to the slightly uneven surfaces, minute interstices exists. Therefore, the pressure between them is reduced similarly to the case where the cooling member and the processing chamber are disposed at a distance from each other.

Further, at this time, under the control of the control means, cooling fluid is supplied into the cooling passage of the cooling member by the cooling fluid supply means. However, since the pressure in the annulus of the seal member is reduced, the heat is difficult to transmit from the processing chamber to the cooling member (the processing chamber is difficult to be cooled by the cooling member), and therefore, the temperature of the processing chamber rises efficiently.

Thereafter, under the control of the control means, the pressure in the annulus of the seal member is set at a higher pressure than the predetermined pressure by the second exhaust means, and high-frequency power is applied to the plasma generating means by the power applying means. At the same time, processing gas is supplied into the processing chamber by the gas supply means, and a plasma is formed from the supplied processing gas. Thereby, a substrate (silicon substrate or glass substrate, for example) which is appropriately loaded into the processing chamber is treated (through an etching process, ashing process, or film deposition process, for example) by the plasma formed from the processing gas. At this time, the pressure in the processing chamber is reduced by the first exhaust means. Furthermore, cooling fluid continues to be supplied into the cooling passage of the cooling member by the cooling fluid supply means.

When a plasma is generated, the processing chamber is heated by the heat of the generated plasma. However, since the pressure in the annulus of the seal member is set at a higher pressure than the predetermined pressure, the heat is easy to transmit from the processing chamber to the cooling member (the processing chamber is easy to be cooled by the cooling member) compared with when plasma is not generated, and therefore, the temperature of the inner surface of the processing chamber is prevented from rising. Thereby, the temperature of the inner surface of the processing chamber is maintained within a certain range both before and after starting to process a substrate.

Thus, according to the plasma processor of the present invention, by regulating the pressure in the annulus of the seal member, the heat is made easy or difficult to transmit to the cooling member. Thereby, it is possible to instantly switch between cooling and not cooling the processing chamber, and therefore, it is possible to regulate the temperature of the inner surface of the processing chamber with excellent response. Further, when heating the processing chamber, for example, when heating the processing chamber in advance to raise the temperature of the inner surface of the processing chamber to a predetermined temperature before starting to process the substrate, the processing chamber can be efficiently heated by setting the pressure in the annulus of the seal member at the predetermined pressure.

Furthermore, since it is configured so that the processing chamber is cooled via the cooling member provided in contact with the outer surface of the processing chamber or provided at a distance from the outer surface of the processing chamber, even when the temperature of the inner surface of the processing chamber is regulated so as to be equal to or more than 100 degrees C., it is not possible that the temperature of the cooling fluid flowing through the cooling member exceeds 100 degrees C., and therefore, water can be used as cooling fluid. When water is used as cooling fluid, the cooling means can be constructed at low cost. In this sense, it is preferable to use water as cooling fluid.

It is preferred that the predetermined pressure P (Pa) is set so as to satisfy the following relationship:

$$P \leq 3.11 \times 10^{-6} \times T/(g \times \delta^2)$$

(where, T (K) is the absolute temperature of the air, $\delta$ ($\mu$m) is the molecular diameter of the air (=$3.72 \times 10^{-4}$), and g ($\mu$m) is the distance between the cooling member and the processing chamber.)

The heat insulation effect achieved by reducing the pressure appears more remarkably when the distance between the cooling member and the processing chamber is set to be shorter than the mean free path of the air. Since the distance between the cooling member and the processing chamber can be set to be shorter than the mean free path of the air when setting the pressure so as to satisfy the above equation, it is possible to more effectively prevent the heat from transmitting from the processing chamber to the cooling member, and therefore, the processing chamber can be more efficiently heated by the heating means.

Further, it is preferred that the distance between the cooling member and the processing chamber is set to be more than 0 $\mu$m and equal to or less than 100 $\mu$m. When the distance is more than 100 $\mu$m, the heat insulating action of the air existing between the cooling member and the processing chamber is increased, thereby, it is impossible to efficiently transmit the heat from the processing chamber to the cooling member, which causes a reduction of cooling efficiency and a worse response. Therefore, when the distance is set within the above range, the temperature of the processing chamber can be regulated more efficiently.

In addition, it is preferred that the control means is configured to control the second exhaust means so that the pressure in the annulus of the seal member is high when the amount of the high-frequency power applied to the plasma generating means by the power applying means is large, and to control the second exhaust means so that the pressure in the annulus of the seal member is low when the amount of the high-frequency power applied to the plasma generating means by the power applying means is small. The heat of the generated plasma is increased corresponding to the high-frequency power applied to the plasma generating means. Therefore, it is sufficient to transmit a small amount of heat from the processing chamber to the cooling member when the applied high-frequency power (the heat of the plasma) is small, and it is necessary to transmit a large amount of heat from the processing chamber to cooling member when the applied high-frequency power (the heat of the plasma) is large. Therefore, as described above, when it is configured so that the pressure in the annulus of the seal member is adjusted according to the high-frequency power applied to the plasma generating means, it is possible to adjust the amount of the heat transmitting from the processing chamber to the cooling member, and therefore, the temperature of the processing chamber can be regulated more suitably.

It is preferred that the plasma processor is configured to further comprise temperature detection means for detecting the temperature of the processing chamber and the control means is configured to control the operation of the heating means based on the temperature detected by the temperature detection means to set the temperature of the processing chamber at a predetermined temperature. When configured like this, the temperature of the processing chamber can be regulated efficiently and with high accuracy.

Effects of the Invention

As described above, according to the plasma processor of the present invention, since it is configured so that the cooling state of the processing chamber is changed by regulating the pressure in the annulus of the seal member, it is possible to regulate the temperature of the inner surface of the processing chamber efficiently and with excellent response with a low-cost configuration.

Figure 1:
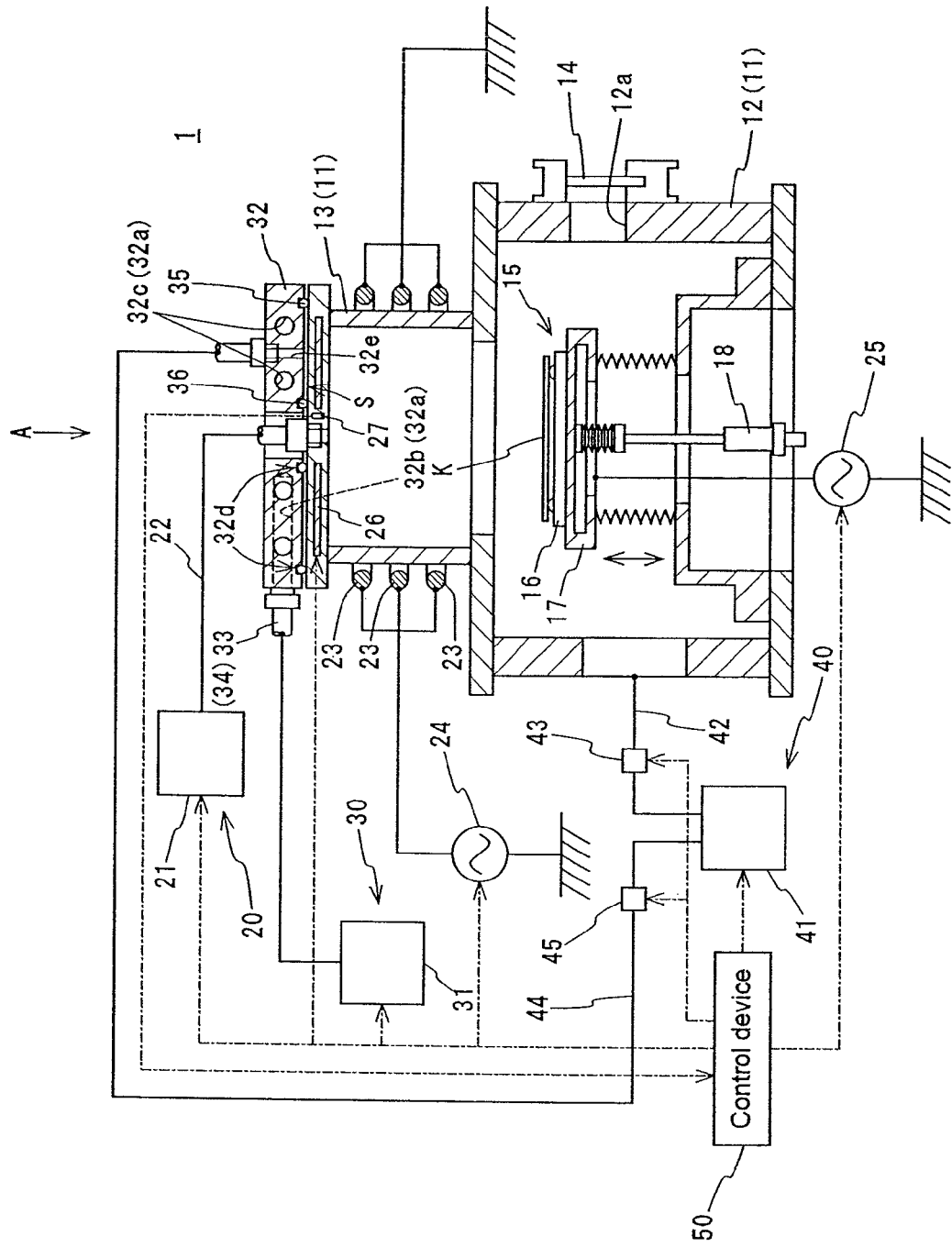
FIG. 1 is a cross-sectional view showing a schematic configuration of an etching apparatus according to one embodiment of the present invention.

LEGEND 1 etching apparatus (plasma processor)
11 processing chamber
12 lower container
13 upper container
15 platen
18 elevating cylinder
20 gas supply device
21 processing gas supply section
23 coil
24 high-frequency power supply unit for coil
25 high-frequency power supply unit for platen
26 heater
27 temperature detection sensor
30 cooling device
31 cooling water supply section
32 cooling member
33 supply pipe
34 return pipe
35, 36 seal member
40 exhaust device
41 exhaust pump
44 second exhaust pipe
45 second pressure adjusting mechanism
50 control device
K silicon substrate
S closed space

BEST MODE FOR CARRYING OUT THE INVENTION

Hereinafter, specific embodiments of the present invention will be explained with reference to the accompanying drawings. FIG. 1 is a cross-sectional view showing a schematic configuration of an etching apparatus according to one embodiment of the present invention, and FIG. 2 is a plane view taken in the direction of arrow A in FIG. 1.

Figure 2:
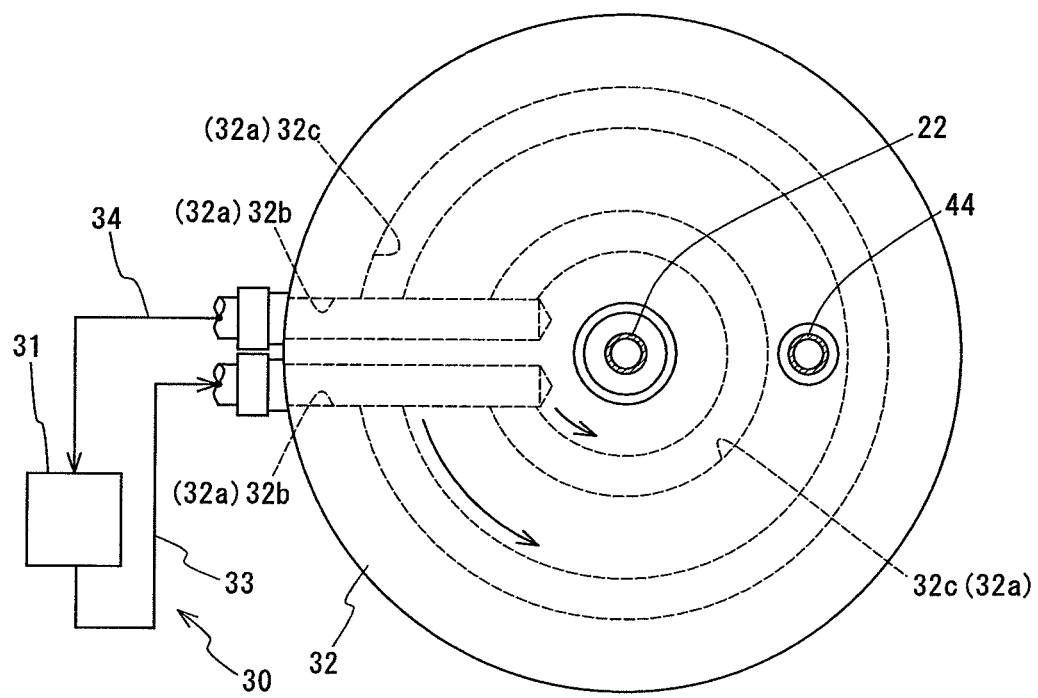
FIG. 2 is a plane view taken in the direction of arrow A in FIG. 1.

As shown in FIGS. 1 and 2, an etching apparatus 1 being a plasma processor of the present embodiment includes: a processing chamber 11 which has a closed space and within which a silicon substrate K being an object for etching is placed; a platen 15 which is disposed in the processing chamber 11 so as to freely go up and down and on which the silicon substrate K is mounted; an elevating cylinder 18 for raising and lowering the platen 15; a gas supply device 20 for supplying a processing gas into the processing chamber 11; a plurality of coils (a plasma generating mechanism) 23 arranged outside the processing chamber 11; a high-frequency power supply unit 24 for coil for applying high-frequency power to each coil 23; a high-frequency power supply unit 25 for platen for applying high-frequency power to the platen 15; a heater 26 for heating the processing chamber 11; a temperature detection sensor 27 for detecting the temperature of the processing chamber 11; a cooling device 30 for cooling the processing chamber 11; an exhaust device 40 for reducing the pressure in the processing chamber 11; and a control device 50 for controlling the operations of the elevating cylinder 18, gas supply device 20, high-frequency power supply unit 24 for coil, high-frequency power supply unit 25 for platen, heater 26, cooling device 30, and exhaust device 40.

The processing chamber 11 is configured with a lower container 12 and upper container 13 each having an inner space, the spaces communicating with each other, and the upper container 13 is formed smaller than the lower container 12. The lower container 12 has an opening portion 12a through which the silicon substrate K is loaded and unloaded, formed in the side wall thereof, and the opening portion 12a is opened and closed by a shutter 14. It is noted that at least a top plate of the upper container 13 is made of metal such as aluminum alloy, for example.

The platen 15 is configured with an upper member 16 and a lower member 17 arranged up and down. The silicon substrate K is mounted on the upper member 16, and the elevating cylinder 18 is connected to the lower member 17.

The gas supply device 20 is configured with a processing gas supply section 21 for supplying etching gas ($SF_6$ gas, for example) and etching-resistant layer forming gas ($C_4F_8$ gas, for example) as processing gas, and a supply pipe 22 for connecting the processing gas supply section 21 and the upper surface of the upper container 13. Etching gas and etching-resistant layer forming gas are supplied from the processing gas supply section 21 through the supply pipe 22 into the upper container 13.

Each of the coils 23 is formed in an annular shape and they are arranged side by side up and down on the outer peripheral portion of the upper container 13. The high-frequency power supply unit 24 for coil applies high-frequency power to the coils 23 to form a magnetic field in the upper container 13. By means of an electric field caused by the magnetic field, a plasma is formed from the etching gas or etching-resistant layer forming gas supplied into the upper container 13. The high-frequency power supply unit 25 for platen applies high-frequency power to the platen 15 to generate a potential difference (bias potential) between the platen 15 and plasma.

The heater 26 and the temperature detection sensor 27 are implanted in the top plate of the upper container 13. The temperature detection sensor 27 is configured with a thermocouple, for example, and transmits the temperature signal of the processing chamber 11 (upper container 13) to the control device 50.

The cooling device 30 is configured with: a cooling water supply section 31 for supplying cooling water; an annular cooling member 32 having a cooling passage 32a through which cooling water flows, and arranged to face the upper surface (top plate) of the upper container 13 at a certain distance therefrom; a supply pipe 33 for connecting the cooling water supply section 31 and one end of the cooling passage 32a; a return pipe 34 for connecting the cooling water supply section 31 and the other end of the cooling passage 32a; and two seal members, a first and second seal members 35 and 36 which are provided between the lower surface of the cooling member 32 and the upper surface of the upper container 13 to be in contact with them, and which are each formed in an annular shape. Cooling water is supplied from the cooling water supply section 31 through the supply pipe 33 into the cooling flow passage 32a, and the cooling water which has flowed through the cooling passage 32a is returned to the cooling water supply section 31 through the return pipe 34.

The cooling member 32 is provided so that the supply pipe 22 of the gas supply device 20 is arranged in the annulus thereof, and the cooling member 32 is made of metal such as aluminum alloy, for example. The cooling member 32 has: two holes 32b opening at the outer peripheral surface thereof; two spaces 32c which are each formed in a C shape in plane view, and each of which communicates with one of the holes 32b at one end side thereof and communicates with the other of the holes 32b at the other end side thereof; two annular channels 32d which each open at the lower surface thereof, and into which the seal members 35 and 36 are inserted, respectively; and a through hole 32e which penetrates vertically and the lower end of which opens between the two annular channels 32d. The holes 32b and the spaces 32c form the cooling passage 32a. The annular channels 32d are formed on the outer peripheral side and inner peripheral side of the lower surface of the cooling member 32, respectively. It is preferred that the distance between the lower surface of the cooling member 32 and the upper surface of the upper container 13 is set to be more than 0 μm and equal to or less than 100 μm.

The supply pipe 33 is connected to one of the holes 32b, and the return pipe 34 is connected to the other of the holes 32b. The first seal member 35 is inserted into the outer annular channel 32d, and the second seal member 36 is inserted into the inner annular channel 32d. A closed space S is formed within the annulus of the first seal member 35 (the portion surrounded by the cooling member 32, the upper container 13, and the seal members 35 and 36).

The exhaust device 40 is configured with an exhaust pump 41, a first exhaust pipe 42 for connecting the exhaust pump 41 and the lower container 12, and a first pressure adjusting mechanism 43 provided on the first exhaust pipe 42 for adjusting the pressure in the processing chamber 11. The air within the lower container 12 is exhausted through the first exhaust pipe 42 by the exhaust pump 41, and the pressure in the processing chamber 11 is reduced to a predetermined pressure adjusted by the first pressure adjusting mechanism 43.

Further, the exhaust device 40 further includes a second exhaust pipe 44 for connecting the exhaust pump 41 and the upper end of the through hole 32e of the cooling member 32, and a second pressure adjusting mechanism 45 provided on the second exhaust pipe 44 for adjusting the pressure in the closed space S. The air within the closed space S is exhausted through the second exhaust pipe 44 and the through hole 32e, and the pressure in the closed space S is set at a predetermined pressure adjusted by the second pressure adjusting mechanism 45.

The control device 50 controls the operations of the elevating cylinder 18, processing gas supply section 21, high-frequency power supply unit 24 for coil, high-frequency power supply unit 25 for platen, heater 26, cooling water supply section 31, exhaust pump 41, first pressure adjusting mechanism 43 and second pressure adjusting mechanism 45.

Figure 3:
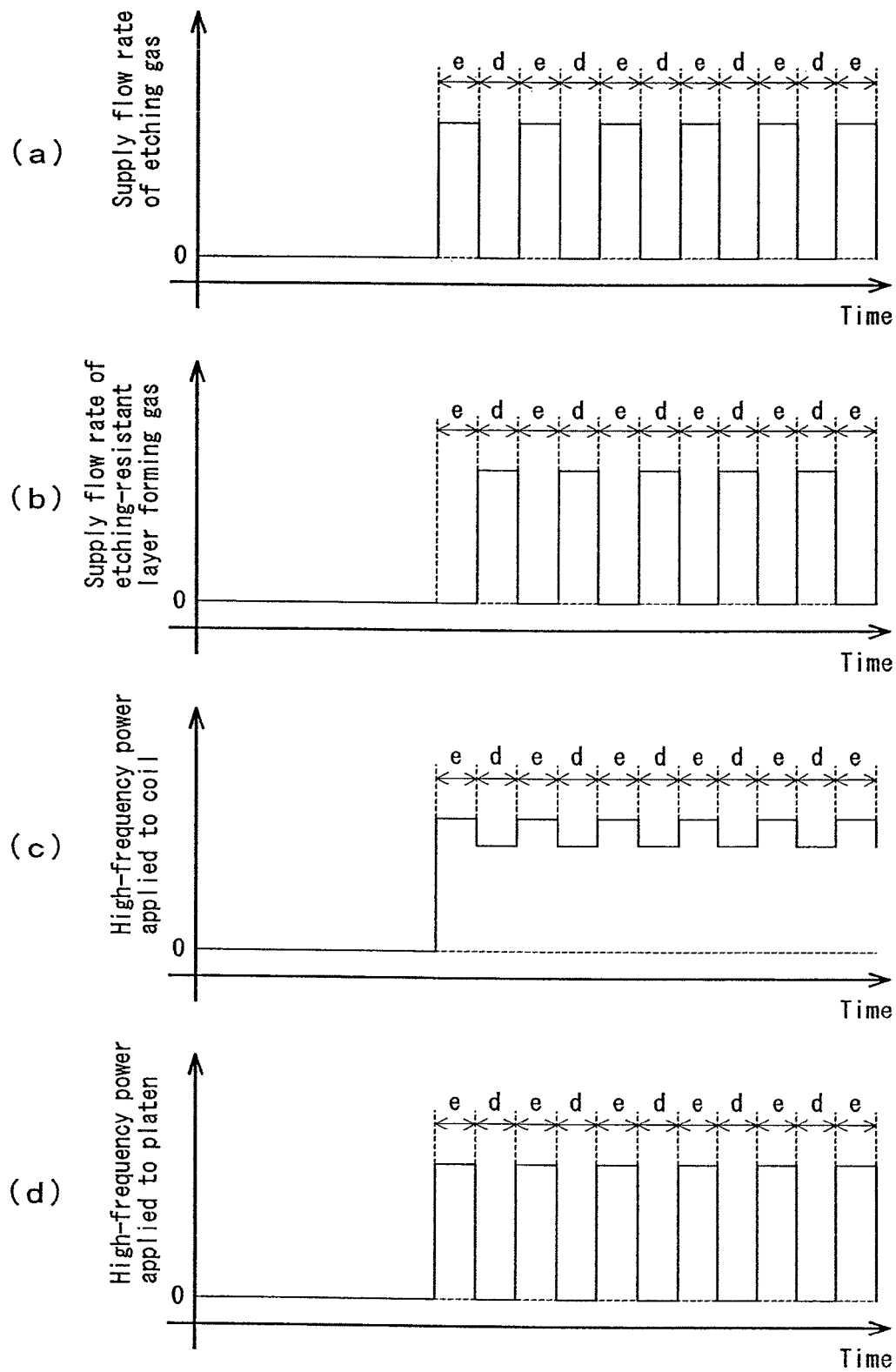
FIG. 3 is a timing chart showing controlled states of a supply flow rate of etching gas, a supply flow rate of etching-resistant layer forming gas, high-frequency power applied to coils, and high-frequency power applied to a platen.

Further, as shown in FIG. 3, the control device 50 alternately repeats an etching step e for etching the silicon substrate K and an etching-resistant layer forming step d for forming an etching-resistant layer on the silicon substrate K. In the etching step e, high-frequency power is applied to the coils 23 and the platen 15 by the high-frequency power supply unit 24 for coil and the high-frequency power supply unit 25 for platen, respectively; etching gas is supplied from the processing gas supply section 21 into the processing chamber 11; and the pressure in the processing chamber 11 is set at a predetermined pressure by the exhaust pump 41 and the first pressure adjusting mechanism 43. On the other hand, in the etching-resistant layer forming step d, high-frequency power is applied to the coils 23 by the high-frequency power supply unit 24 for coil; etching-resistant layer forming gas is supplied from the processing gas supply section 21 into the processing chamber 11; and the pressure in the processing chamber 11 is set at a predetermined pressure by the exhaust pump 41 and the first pressure adjusting mechanism 43.

Figure 4:
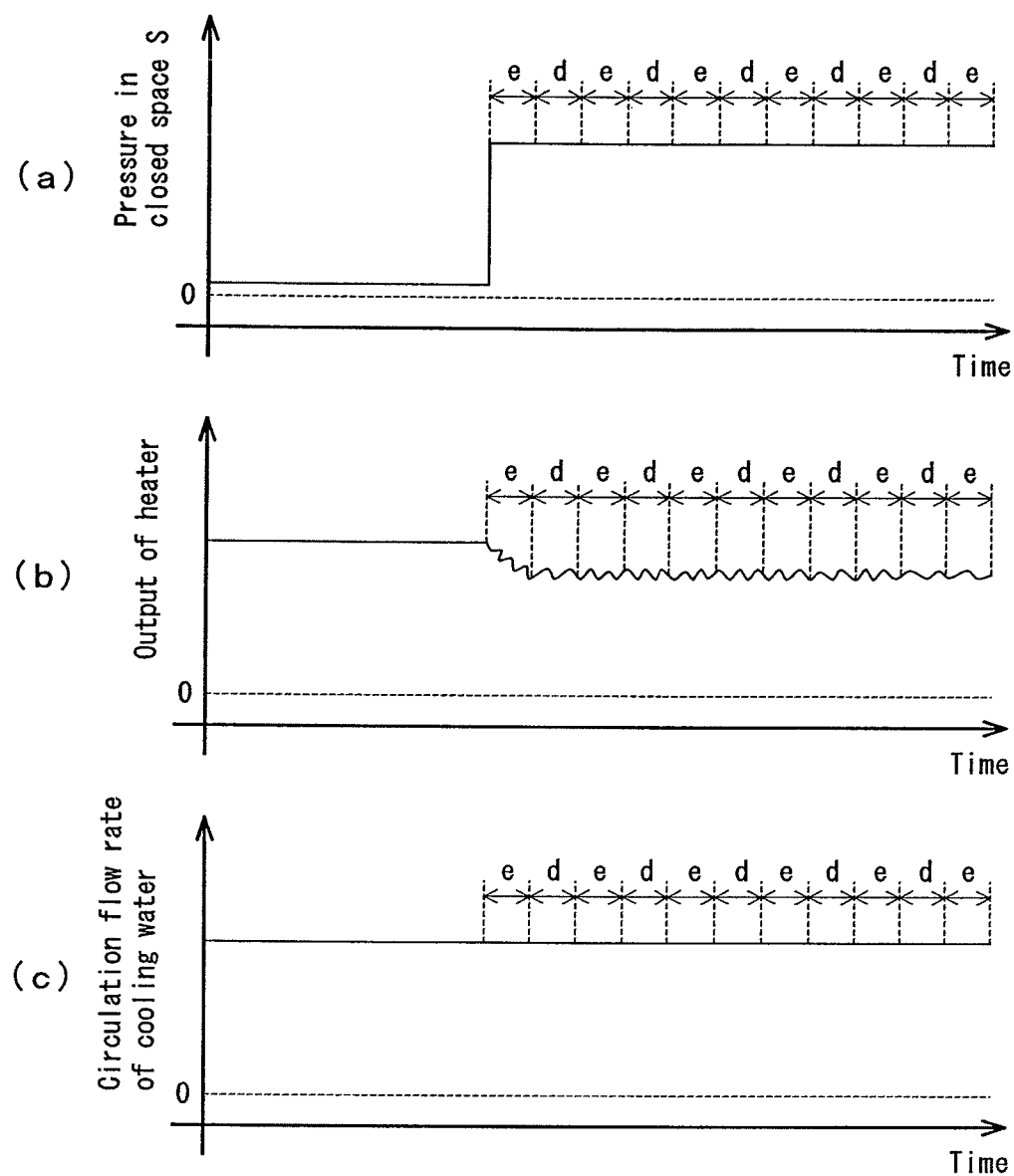
FIG. 4 is a timing chart showing controlled states of the pressure in a closed space, output of a heater, and a circulation flow rate of cooling water.

Further, as shown in FIG. 4(a), the control device 50 controls the exhaust pump 41 and the second pressure adjusting mechanism 45 so that the pressure in the closed space S is reduced to a predetermined pressure when high-frequency power is not applied to the coils 23 by the high-frequency power supply unit 24 for coil (before starting the etching step e and etching-resistant layer forming step d) and the pressure in the closed space S is set at atmospheric pressure when high-frequency power is applied to the coils 23 by the high-frequency power supply unit 24 for coil (after starting the etching step e and etching-resistant layer forming step d).

Here, it is preferred that the predetermined pressure P (Pa) is set so as to satisfy the relationship represented by the following equation 1.

$$P \leq 3.11 \times 10^{-} \times T/(g \times \delta^2) \qquad \text{Equation 1}$$

Where, T (K) is the absolute temperature of the air, δ (μm) is the molecular diameter of the air (=$3.72 \times 10^{-4}$), and g (μm) is the distance between the cooling member 32 and the upper container 13.

For example, in the case where the distance g between the cooling member 32 and the upper container 13 is set at 100 μm, when the air temperature T is 293 K and the molecular diameter δ of the air is $3.72 \times 10^{-4}$ μm, it can be found from the above equation 1 that the pressure P is about 65.85 (Pa). Therefore, the pressure P is set to be equal to or less than 65.85 (Pa). Further, in the case where the distance g between the cooling member 32 and the upper container 13 is set at 1 μm, when the air temperature T is 293 K and the molecular diameter 6 of the air is $3.72 \times 10^{-4}$ μm, it can be found from the above equation 1 that the pressure P is about 6585 (Pa). Therefore, the pressure P is set to be equal to or less than 6585 (Pa).

Further, as shown in FIG. 4(b), the control device 50 receives the temperature signal of the upper container 13 obtained from the temperature detection sensor 27, and based on the received temperature signal, controls the output of the heater 26 to set the temperature of the inner surface of the upper container 13, consequently, the temperature of the inner surface of the processing chamber 11, within a predetermined range (between 120 degrees C. and 150 degrees C., for example).

It is noted that the control device 50 alternately repeats the etching step e and the etching-resistant layer forming step d after the detected temperature obtained from the temperature detection sensor 27 reaches within the predetermined range. Further, as shown in FIG. 4(c), the control device 50 controls the cooling water supply section 31 so that cooling water constantly circulates.

According to the etching apparatus 1 of the present embodiment configured as described above, first of all, under the control of the control device 50, the pressure in the closed space S is reduced to the predetermined pressure by the exhaust pump 41 and the second pressure adjusting mechanism 45 and the processing chamber 11 is heated by the heater 26 until the temperature of the processing chamber 11 detected by the temperature detection sensor 27 reaches within a predetermined range.

At this time, under the control of the control device 50, cooling water is supplied from the cooling water supply section 31 through the supply pipe 33 into the cooling passage 32a of the cooling member 32 and the cooling water which has flowed through the cooling passage 32a is returned into the cooling water supply section 31 through the return pipe 34. Although cooling water circulates between the cooling water supply section 31 and the cooling member 32, the heat is difficult to transmit from the processing chamber 11 to the cooling member 32 (the processing chamber 11 is difficult to be cooled by the cooling member 32) since the pressure in the closed space S is reduced. Therefore, the temperature of the processing chamber 11 rises efficiently.

Thereafter, when the temperature of the processing chamber 11 detected by the temperature detection sensor 27 reaches within the predetermined range, under the control of the control device 50, the etching step e and the etching-resistant layer forming step d are alternately repeated, and thereby etching the silicon substrate K appropriately carried in the processing chamber 11 and mounted on the platen 15. At this time, the control device 50 controls the exhaust pump 41 and the second pressure adjusting mechanism 45 to return the pressure in the closed space S to atmospheric pressure. Additionally, cooling water continues to be supplied from the cooling water supply section 31 to the cooling member 32 and circulates.

In the etching step e, etching gas is supplied into the processing chamber 11 and a plasma is formed therefrom. Radicals in the plasma react with silicon atoms, and ions in the plasma are moved toward the platen 15 by a bias potential and collide with the silicon substrate K. Thereby, trenches and/or holes having predetermined width and depth are fabricated in the silicon substrate K.

On the other hand, in the etching-resistant layer forming step d, etching-resistant layer forming gas is supplied into the processing chamber 11 and a plasma is formed therefrom. Polymers which are generated from radicals in the plasma deposit on the surface of the silicon substrate K (the side walls and bottom surfaces etc. of the trenches and/or holes fabricated by etching). Thereby, an etching-resistant layer (fluorocarbon film) is formed on the silicon substrate K.

Such etching step e and etching-resistant layer forming step d are alternately repeated. Thereby, the etching proceeds in the direction of the depth of the trenches and/or holes, while the side walls of the trenches and/or holes of the silicon substrate K are protected by the etching-resistant layer.

When plasma is generated in the etching step e and the etching-resistant layer forming step d, the processing chamber 11 is heated by the heat of the generated plasma. However, since the pressure in the closed space S is returned to atmospheric pressure, the heat is easy to transmit from the processing chamber 11 to the cooling member 32 (the processing chamber 11 is easy to be cooled by the cooling member 32) compared with before performing the etching step e and etching-resistant layer forming step d, that is, when plasma is not generated, and therefore, the temperature of the inner surface of the processing chamber 11 is prevented from rising. Further, also at this time, the output of the heater 26 is adjusted based on the temperature detected by the temperature detection sensor 27. Thereby, the temperature of the inner surface of the processing chamber 11 is maintained within a certain range both before and after starting the etching step e and etching-resistant layer forming step d.

Thus, according to the etching apparatus 1 of the present embodiment, by regulating the pressure in the closed space S, the switching between when making the heat easy to transmit to the cooling member 32 and when making the heat difficult to transmit to the cooling member 32 is performed. Thereby, it is possible to instantly switch between when cooling and not cooling the processing chamber 11, and therefore, the temperature can be regulated with excellent response. Further, when the processing chamber 11 is heated, for example, when the processing chamber 11 is heated in advance in order to raise the temperature of the inner surface of the processing chamber 11 to a predetermined temperature before starting the etching step e and etching-resistant layer forming step d, the processing chamber 11 can be heated efficiently by reducing the pressure in the closed space S.

Furthermore, since it is configured that the processing chamber 11 is cooled via the cooling member 32 provided at a distance from the outer surface of the processing chamber 11, even when the temperature of the inner surface of the processing chamber 11 is regulated so as to be equal to or more than 100 degrees C., it is not possible that the temperature of the cooling water flowing through the cooling member 32 exceeds 100 degrees C., and therefore, there is no possibility that the cooling water boils and expands. By using water as cooling fluid, the cooling device 30 can be constructed at lower cost.

The heat insulation effect achieved by reducing the pressure appears more remarkably when the distance between the cooling member 32 and the upper container 13 is set to be shorter than the mean free path of the air. Since the distance between the cooling member 32 and the upper container 13 can be set to be shorter than the mean free path of the air when the pressure in the closed space S at the time of the pressure reduction is set so as to satisfy the said equation 1, it is possible to more effectively prevent the heat from transmitting from the processing chamber 11 to the cooling member 32, and therefore, the processing chamber 11 can be more efficiently heated by the heater 26.

Further, when the distance between the lower surface of the cooling member 32 and the upper container 13 is set to be more than 0 μm and equal to or less than 100 μm, the temperature of the processing chamber 11 can be regulated more efficiently. When the distance is more than 100 μm, the heat insulating action of the air existing in the closed space S is increased, thereby, it is impossible to efficiently transmit the heat from the processing chamber 11 to the cooling member 32, which causes a reduction of cooling efficiency and a worse response.

The control device 30 is configured to control the output of the heater 26 based on the detected temperature obtained from the temperature detection sensor 27 to set the temperature of the inner surface of the processing chamber 11 within the predetermined range. Therefore, the temperature of the processing chamber 11 can be regulated efficiency and with high accuracy.

Thus, one embodiment of the present invention has been described above. However, specific modes in which the present invention can be realized are not limited thereto.

In the above embodiment, the pressure in the closed space S when high-frequency power is applied to the coils 23 by the high-frequency power supply unit 24 for coil is set at atmospheric pressure. However, the pressure is not limited thereto. Any value is acceptable as long as it is higher than the pressure in the closed space S when high-frequency power is not applied to the coils 23 by the high-frequency power supply unit 24 for coil. Since a higher pressure makes the heat easier to transmit, the higher the pressure is, the more efficiently the processing chamber 11 is cooled.

Further, the arrangement position and shape of the cooling member 32 are not limited to the above embodiment. Additionally, instead of arranging the cooling member 32 at a distance from the upper container 13, the cooling member 32 may be arranged in contact with the upper container 13. The reason why the cooling member 32 can be in contact with the upper container 13 is that, since the contact surface of the cooling member 32 and the contact surface of the upper member 13 are not flat to be exact, but slightly uneven, they cannot stick firmly to each other, and due to the uneven surfaces, minute interstices exist.

The heat of the generated plasma is increased corresponding to the high-frequency power applied to the coils 23. Therefore, it is sufficient to transmit a small amount of heat from the processing chamber 11 to the cooling member 32 when the applied high-frequency power (the heat of the plasma) is small, and it is necessary to transmit a large amount of heat from the processing chamber 11 to cooling member 32 when the applied high-frequency power (the heat of the plasma) is large. Therefore, it is preferred that the control device 50 is configured to control the exhaust pump 41 and the second pressure adjusting mechanism 45 to increase the pressure in the closed space S when the amount of the high-frequency power applied to the coils 23 by the high-frequency power supply unit 24 for coil is large, and to reduce the pressure in the closed space S when the amount of the high-frequency power applied to the coils 23 by the high-frequency power supply unit 24 for coil is small. Thus, when it is configured so that the pressure in the closed space S is adjusted according to the high-frequency power applied to the coils 23, it is possible to adjust the amount of the heat transmitting from the processing chamber 11 to the cooling member 32, and therefore, the temperature of the processing chamber 11 can be regulated more suitably.

Furthermore, in the above embodiment, the etching apparatus 1 has been described as an example of the plasma processor. However, the present invention is not limited to the etching apparatus 1, and the plasma processor of the present invention may be an apparatus performing an ashing process, a film deposition process or the like. Further, a substrate being an object for the plasma processing is not limited to the silicon substrate K, and any substrate, such as a glass substrate, etc., is acceptable.

In the above embodiment, it is configured so that a plasma is formed from the processing gas in the processing chamber 11 by applying high-frequency power to the coils 23. However, the configuration is not limited thereto. A parallel plate electrode type plasma generating mechanism may be used, for example. This plasma generating mechanism is configured with plate-shaped electrodes arranged in the processing chamber 11 to face each other at a predetermined distance, and high-frequency power is applied to between the electrodes.

Further, a single exhaust device 40 has a function to reduce the pressure in the processing chamber 11 and a function to reduce the pressure in the closed space S. However, instead of the exhaust device 40, two exhaust devices, a first exhaust device for reducing the pressure in the processing chamber 11 and a second exhaust device for reducing the pressure in the closed space S, may be provided. Further, when increasing the pressure in the closed space S, for example, when the pressure in the closed space S is returned from a reduced pressure to atmospheric pressure, it may be configured so that the air is introduced by an valve appropriately provided in the exhaust device 40 to increase the pressure in the closed space S, or compressed air is supplied by a valve and compressed air supply source appropriately provided in the exhaust device 40 to increase the pressure in the closed space S.

In the above embodiment, the cooling device 30 is configured so that cooling water circulates between the cooling water supply section 31 and the cooling passage 32a of the cooling member 32. However, cooling water is not necessary to be circulated. Further, industrial water may be available as cooling water.

Industrial Applicability

As described in detail above, the present invention can be preferably applied to a plasma processor capable of regulating the temperature of an inner surface of a processing chamber efficiently and with excellent response with a low-cost configuration.

What is claimed is:

1. A plasma processor, comprising at least:
a processing chamber having a closed space and holding a substrate therein;
gas supply mechanism for supplying at least an etching gas and an etching-resistant layer forming gas for forming polymers into the processing chamber;

first exhaust mechanism for reducing the pressure in the processing chamber;

power applying mechanism for applying high-frequency power;

plasma generating mechanism for, by high-frequency power being applied by the power applying mechanism, forming a plasma from the processing gas supplied into the processing chamber;

heating mechanism for heating the processing chamber;

cooling mechanism for cooling the processing chamber, the cooling mechanism configured with:
- a metallic cooling member having a cooling passage through which cooling fluid flows and arranged to face the outer surface of the processing chamber at a distance therefrom;
- cooling fluid supply mechanism for supplying the cooling fluid into the cooling passage of the cooling member; and
- an annular seal member provided between the cooling member and the processing chamber to be in contact with them;

second exhaust mechanism for reducing the pressure in the annulus of the seal member; and control mechanism for controlling the operations of the gas supply mechanism, first exhaust mechanism, second exhaust mechanism, power applying mechanism, heating mechanism and cooling mechanism, the plasma processor producing deposits within the processing chamber by processing using the processing gas, wherein the cooling fluid is water, the distance between the cooling member and the processing chamber is set to be more than 0 μm and equal to or less than 100 μm, the control mechanism is configured to control the second exhaust mechanism so that the pressure in the annulus of the seal member is reduced to a predetermined first target pressure when the power applying mechanism does not apply high-frequency power to the plasma generating mechanism, and to control the second exhaust mechanism so that the pressure in the annulus of the seal member becomes a second target pressure higher than the first target pressure when the power applying mechanism applies high-frequency power to the plasma generating mechanism, and the first target pressure P (Pa) is a predetermined pressure which is set so as to satisfy the following relational equation:

$$P \leq 3.11 \times 10^{-6} \times T/(g \times \delta^2)$$

(where, $T$ (K) is the absolute temperature of the air, $\delta$ (μm) is the molecular diameter of the air ($=3.72 \times 10^{-4}$), and $g$ (μm) is the distance between the cooling member and the processing chamber) and the control mechanism is configured to control the second exhaust mechanism so that the pressure in the annulus of the seal member is high when the amount of the high frequency power applied to the plasma generating mechanism by the power applying mechanism is large, and to control the second exhaust mechanism so that the pressure in the annulus of the seal member is low when the amount of the high-frequency power applied to the plasma generating mechanism by the power applying mechanism is small.

2. The plasma processor according to claim 1, further comprising:

temperature detection mechanism for detecting the temperature of the processing chamber, wherein the control mechanism is configured to control the operation of the heating mechanism based on the temperature detected by the temperature detection mechanism to set the temperature of the processing chamber at a predetermined temperature.

* * * * *